United States Patent
Li et al.

(10) Patent No.: US 9,563,127 B2
(45) Date of Patent: Feb. 7, 2017

(54) SUBSTRATE PATTERNING USING A DIGITAL LIQUID CRYSTAL ARRAY

(71) Applicants: Chengzhang Li, San Jose, CA (US); Cheng Chun Chris Liang, Castro Valley, CA (US)

(72) Inventors: Chengzhang Li, San Jose, CA (US); Jianbo Li, Huai-An (CN)

(73) Assignee: AVENTGENE INC., Pleasanton, CA (US)

(*) Notice: Subject to any disclaimer, the term of this patent is extended or adjusted under 35 U.S.C. 154(b) by 0 days.

(21) Appl. No.: 14/501,039

(22) Filed: Sep. 30, 2014

(65) Prior Publication Data

US 2016/0091740 A1  Mar. 31, 2016

(51) Int. Cl.
*G02F 1/1335* (2006.01)
*G03F 7/20* (2006.01)

(52) U.S. Cl.
CPC ......... *G03F 7/201* (2013.01); *G02F 1/133509* (2013.01); *G03F 7/2057* (2013.01)

(58) Field of Classification Search
CPC .................. G02F 1/133509; G03F 7/2057
See application file for complete search history.

(56) References Cited

U.S. PATENT DOCUMENTS

| | | | | |
|---|---|---|---|---|
| 5,998,069 A * | 12/1999 | Cutter | ............... | G03F 1/144 250/492.22 |
| 7,023,528 B2 * | 4/2006 | Hsu | ............... | G03F 1/26 355/53 |
| 2007/0134831 A1 * | 6/2007 | Jung | ............... | B01J 19/0046 438/30 |
| 2009/0023609 A1 * | 1/2009 | Jung | ............... | B01J 19/0046 506/32 |

* cited by examiner

*Primary Examiner* — Phu Vu
(74) *Attorney, Agent, or Firm* — Dahyee Law Group; Leon E. Jew; Rouzbeh Alani

(57) ABSTRACT

The invention teaches a system and method for catalyzing on a substrate. The system includes a light source and a digital light patterning device which is controlled by a controller coupled to a computer. The digital patterning device includes an array of liquid crystals, each of which being electronically controlled by the computer through the controller. When a liquid crystal is on, the light from the light source passes through the liquid crystal. When it is off, the light is blocked. According to the visual image pattern presented in the computer's interface, the array, wherein some crystals are on and some are off, shows a light pattern which is consistent with the visual image pattern on the computer screen. Accordingly, the patterned light is shed onto a substrate where the light catalyzes a chemical reaction proximate a substrate.

7 Claims, 4 Drawing Sheets

SUBSTRATE PATTERNING USING A DIGITAL LIQUID CRYSTAL ARRAY

FILED OF THE INVENTION

The present invention generally relates to substrate patterning technology used in integrated semiconductor manufacturing. More particularly, the invention relates to a system and method for substrate patterning using a digital liquid crystal array coupled to a computer.

BACKGROUND OF THE INVENTION

In semiconductor design, and more specifically in substrate patterning of computer chips, a number of photolithographic masks were commonly used. The process required photolithographic protection of sections of a substrate. The masks protected the semiconductor layers during etching. Each layer required a unique mask design. The cost to implement this type of design was increased since printing and patterning each mask separately required a lengthened amount of time and cost.

In integrated circuit design, technology advanced and discoveries were made involving the new apparatus for catalyzing a reaction on a substrate comprising a light source. In particular, the invention of the ultraviolet (UV) light source which is directed toward micromirrors. One advantage of catalyzing chemical reactions using UV light is that it provides photons having the required high energy for the reaction. UV light is also advantageous due to its wavelength providing high resolution. The micromirrors are strategically positioned to redirect light from a UV light source towards the substrate. A computer is then connected to control the micromirror positioning. A reaction chamber is then placed in the path of light. The micromirror redirects the light and catalyzes a chemical reaction imminent on the substrate. The light catalyzed reaction can occur on the surface of the substrate.

U.S. Pat. No. 5,626,784, issued to Garner, discloses a method for substrate patterning using a digital optical chemistry micromirror imager. The method is used for catalyzing a reaction on a substrate. The process involves a UV light, along with a micromirror which is positioned to redirect light from the UV light source. The redirected light catalyzes a chemical reaction on a substrate. While a computer is connected, it is used for the purpose of controlling the positioning of mirrors within the micromirror. This allows the light to be redirected to specific portions of a substrate. The substrate may be placed in a reaction chamber. The redirected light from the micromirror can catalyze a chemical reaction imminent to the substrate as the substrate is in a reaction chamber. The problem of this system is that the redirected light from the micro-mirror may not be sharp enough and the light pattern on the substrate may not be identical to the designed pattern.

What is desired is a system that provides a pattern of light exposure identical with the designed pattern and allows the light from the light source directly shed on the substrate.

What is further desired is that the light pattern provided by the system can be amended or changed via a user interface coupled to a computer.

SUMMARY OF THE INVENTION

The invention teaches a system and method for catalyzing on a substrate using a digitally controlled array of liquid crystals. The system includes a light source and a digital light patterning device which is controlled by a controller coupled to a computer. The digital patterning device includes an array of liquid crystals, each of which being electronically controlled by the computer through the controller. When a liquid crystal is on, the light from the light source passes through the liquid crystal. When it is off, the light is blocked. According to the visual image pattern presented in the computer's interface, the array, wherein some crystals are on and some are off, shows a light pattern which is consistent with the visual image pattern on the computer screen. Accordingly, the patterned light is shed onto a substrate where the light catalyzes a chemical reaction proximate a substrate. The binary code implemented in the invention controls the digital on/off switch of the illuminating light source through the crystals to monitor and control the pattern of the chip substrate.

The system according to this invention makes it possible that a series of different light patterns is applied in a short period of time. This saves time and cost for replacing a series of physical masks.

The present invention also applies to biochip design. The photolithography method creates challenges to pattern and protect light catalyzed chemical reactions on substrates in the field of biochip design as well. Photolithographic masks are incapable for design for reasonable cost to achieve the diversity of arrays.

Photolithography and photography shares some fundamental principles. The pattern in etching resist is created by exposing it to light. For some applications a projected image is used with an optical mask. The image for the mask originates from a computerized data file. The data file is written on a square fused quartz substrate. The substrate is covered with a layer of chromium using a photolithographic process. When a beam of electrons or laser is used, the pattern to define the data is exposed. The pattern travels over the surface of the substrate often times in a vector manner. When the photoresist on the mask is exposed, and the chrome is etched away, the illumination light has a clear path to travel through. Thus, photolithography is used because it can create extremely small patterns as small as a few tens of nanometers in size. It can create patterns over an entire surface in a cost effective way thus making it possible to use in semiconductor design including printed circuit board designs.

Furthermore, photolithography may also be referred to as optical lithography or UV lithography. Photolithography is a process used to pattern parts on the bulk of a substrate. The process is done by using light (such as UV light) to transfer a geometric pattern from a photomask to a light-sensitive chemical photoresist on the substrate. With the addition of chemical treatments, the exposure pattern can engrave or enable deposition of a new material in the desired pattern onto the material underneath the photoresist.

The present invention can be a method of patterning on a substrate by implementing a light beam to illuminate a digital liquid crystal array. For example, a UV light beam sheds onto a liquid crystal array layer surrounded by a transparent glass substrate. The UV light passes through the liquid crystal array layer and onto a chip substrate. Additionally, the substrate can be placed in a reaction chamber; the light passing through the liquid crystal array onto the substrate catalyzes a light sensitive reaction imminent to the surface of the substrate. Furthermore, the visual representation of the digital liquid crystal array on the computer screen allows for a more effective, cost saving, and faster implementation of controlling and monitoring the substrate patterns for integrated chip design. The user can visually observe the UV light passing through the digital liquid crystal array on the computer screen thus allowing a controlled method of substrate patterning.

Light from the light source can interact with, e.g., a novolak resin imminent to the substrate to produce a negative or a positive pattern in photoresist. The light catalyzed synthesis or reaction can be, e.g., the addition a nucleotide base to the substrate or to a base or polynucleotide chain attached to the substrate. Likewise, the light passed through the digital liquid crystal array can catalyze a chemical reaction, e.g., an amino acid addition reaction or the addition, of organic or inorganic molecules or compounds. For example, during the addition of a nucleic or an amino acid residue, the light can deprotect protecting groups of, e.g., phosphoamidite containing compounds. Light can also be responsible for the cross linking or mono-, bi-, or multi-functional binding groups or compounds to attach molecules such as, fluorochromes, antibodies, carbohydrates, lectins, lipids, and the like, to the substrate surface or to molecules previously or concurrently attached to the substrate.

The method of the present invention can also include the step of obtaining a substrate, and depositing a novolak resin on the substrate prior to shedding the light beam to the photoresist. The method may also comprise the steps of positioning a substrate with a reaction chamber, applying to the surface of the substrate with a light catalyzable reaction chemical, such as a nucleotide or amino acid residue, and exposing the chemicals reagents light. A light catalyzable reaction chemical is activated and a reaction synthesis or decomposition is caused by light at the location where the digital liquid crystal array redirects light onto the chip substrate.

BRIEF DESCRIPTION OF THE DRAWINGS

For a more complete understanding of the features and advantages of the present invention, reference below is made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be mentioned that the present invention provides many applicable inventive concepts which can be embodied in a wide variety of specific contexts. The specific embodiments discussed herein are merely illustrative of specific ways to make and use the invention.

The present invention uses digital light processing technology with optical deprotection photochemistry to create a system and method for generating digital optical chemistry high diversity arrays. With this invention, the limitations of the traditional mask-based photolithographic processes are overcome by eliminating the need for one or more masks. The present invention is also based on the recognition that digital light processing technology can be used to pattern photoresist for the fabrication of substrates, e.g., semiconductor substrates. The present invention thus overcomes the problem of manufacturing and printing photolithographic masks for conventional photoresist patterning.

In the most preferred embodiment, the system for patterning on a substrate according to the invention includes a light source, a light patterning device, and a controller coupled to a computer to digitally control the light patterning device. The light patterning device includes an array of liquid crystals, each of which having an on and off status digitally controlled by the computer. When a liquid crystal's status is on, light from the light source passes through the liquid crystal, and when the liquid crystal's status is off, light from the light source is blocked from passing through the liquid crystal. The array of liquid crystals' configuration is determined by a digital file for one or more particular patterns such that light beam after passing through the light patterning device represents that one or more particular patterns. More specifically, the array of liquid crystals is placed between a first transparent substrate as negative electrode and a second transparent substrate as positive electrode.

In one preferred embodiment, the light source provides a parallel light beam. Yet in another preferred embodiment, the light source provides a shrink light beam. Preferably, the light source provides UV light beam or deep UV light beam.

In one typical embodiment, the system includes a chemical reaction chamber immediately below the light patterning device. The light beam from the light patterning device catalyzes a chemical reaction on a chip substrate placed inside of the chamber.

In another embodiment, the system includes a bio-chemical chamber immediately below the light patterning device. The light beam from the light patterning device catalyzes a biosynthesis on a surface of an object placed inside of the bio-chemical chamber.

Yet in another embodiment, the light patterning device and the light source are integrated in one physical body.

Figure 1:
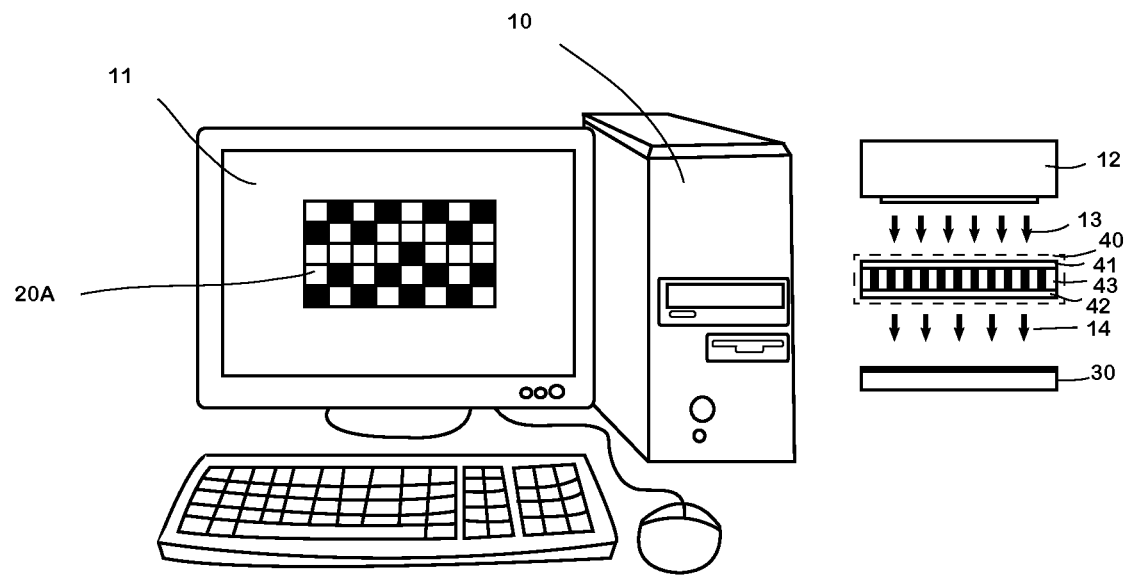
FIG. 1 is a schematic diagram illustrating a system including a computer, a light source, a digitally controlled patterning device which includes a liquid crystal array, and a substrate, where the light passing through the patterning device sheds on the substrate.

Illustrated in FIG. 1 is a basic layout of the substrate pattern system according to the most preferred embodiment. The system includes a computer such as a desk top 10 with a monitor 11 and other accessories such as a keyboard and a mouse. The system also includes a light source 12 that provides parallel light or shrink light. The light from the light source 12 passes down in a direction indicated by arrows 13 and 14. The system also includes a light patterning device 40 which is digitally controlled by the computer through a controller which is not shown in FIG. 1. The light patterning device 40 includes an array of liquid crystals that are controlled by the computer. As an example, the light patterning device 40 includes a transparent glass substrate as a negative electrode 41, a liquid crystal layer 43 and a transparent glass substrate as positive electrode 42. The particular parameter of wavelength for ultraviolet light from the light source 12 is closely related to the thickness of the applied photoresist, with thinner layers corresponding to shorter wavelengths, permitting a reduced aspect ratio and a reduced minimum feature size. The light passes through the transparent glass substrate 41, then through the liquid crystal array 43, and then the transparent glass substrate 42. The "ON" or "OFF" status of each liquid crystal is controlled by the computer. Corresponding to a specific design on the computer, some liquid crystals are "ON" and some are "OFF". The light passes through the liquid crystals with status of "ON". After passing through the crystals, the light is patterned according to the specific design on the computer. The patterned light then sheds onto the substrate chip 30. The controller from the computer is programmed to determine the on/off switching of the UV light illuminating onto the crystals. The patterning of the chip substrate is controlled thereafter by the on and off switching of the illuminating UV beam.

Figure 2:
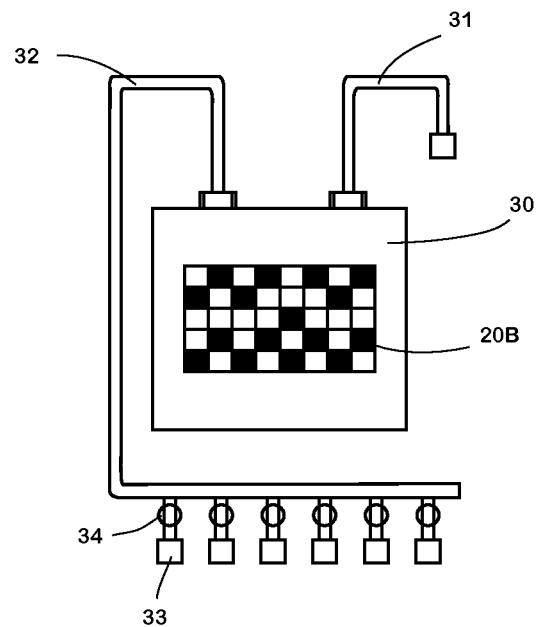
FIG. 2 is a schematic diagram illustrating a top view of the pattern of the chemical reaction/synthesis/bio reaction after UV exposure has been illuminated onto the chip substrate.

FIG. 2 illustrates a top view of the chip substrate pattern 20B of the chemical reaction/synthesis/bio reaction after UV exposure has been illuminated onto the chip substrate. The substrate is mounted in a custom reaction chamber 30 into which chemicals are pumped. The chemicals, including all the standard chemicals for oligonucleotide synthesis, for example, can be kept in syringes and pumped manually. The reaction chamber has a chemical line 31 which pumps the chemicals into the reaction chamber. Alternatively, an automated fluidics system 32, as shown in FIG. 2 can be used to control the input and output of reagents into and out of reaction chamber 30. The reaction chamber 30 can be moved to make multiple arrays at different positions on the substrate.

The fluidics system of the present invention can include a number of reagent bottles, containing synthesis chemicals. The synthesis chemicals can be, e.g., placed under pressure under a non-reactive atmosphere, e.g., Argon or Helium, to provide pressure for chemical delivery and to reduce premature oxidation of the synthesis chemicals 32. Valves 34, which are controlled by the computer 10, can be used to control the timing of the synthesis chemical or chemicals 33 delivered through chemical line 32 to the reaction chamber 30.

Figure 3:
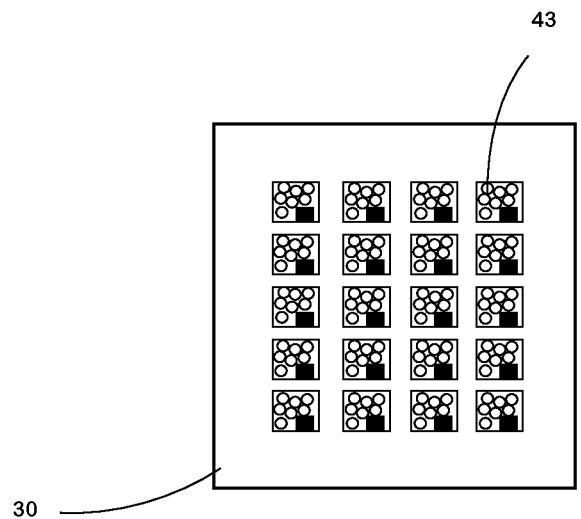
FIG. 3 is a schematic diagram from the top view of the UV light passing through the glass substrate, liquid crystal array and a representation of the sub pixels from the chip pattern on the substrate below the liquid crystal array.

FIG. 3 illustrates a top view of the UV light passing through the glass substrate, liquid crystal array and a representation of the sub pixels from the chip pattern on the substrate below the liquid crystal array. The light illuminates from the UV source onto the transparent glass substrate and liquid crystal array. The chip patterns 43 are visible at the bottom after UV light has passed through the transparent glass, negative electrode, liquid glass array, positive electrode, and onto the chip substrate surface. The chip surface is in a reaction chamber 30 that catalyzes a reaction on the substrate and allows the chip patterns to be designed for the application of Integrated Circuits.

Figure 4:
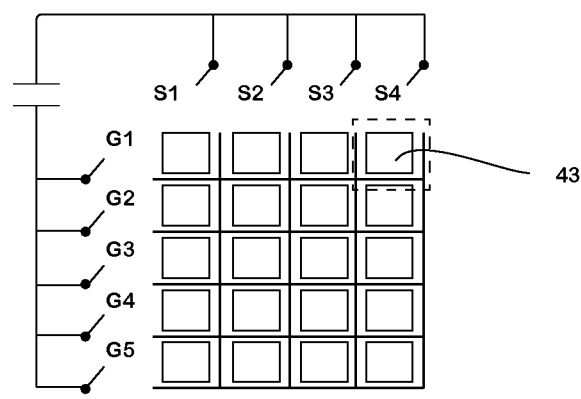
FIG. 4 is a schematic diagram illustrating the light pattern being implemented by electronically controlling each liquid crystal's status of on or off.

FIG. 4 illustrates the light pattern being implemented by electronically controlling the "ON" or "OFF" status of each liquid crystal unit such as 43. When it is "ON", the light goes through the unit. When it is "OFF", the light is blocked. A light pattern is represented by some units are "ON" and some are "OFF" according to the predesigned digital file in the computer.

Figure 5:
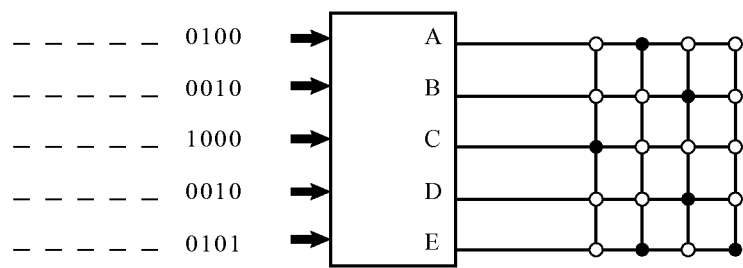
FIG. 5 is a schematic diagram illustrating a binary code for controlling the liquid crystal's status.

FIG. 5 illustrates a binary representation of the control system behind the technology of the invention. The numerical figures 0, 1 correlate to the alphabetical letters A, B, C, etc. The binary system controls the switching on/off of the UV light in the liquid crystal array formation. The on/off switching determines the patterns to the chip substrate.

Figure 6:
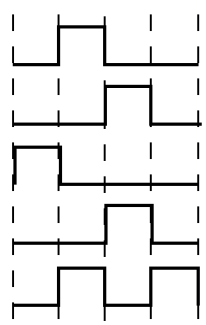
FIG. 6 is a schematic diagram illustrating the pulse signal representing the binary code of FIG. 5.

FIG. 6 illustrates the pulse signal representing the binary code of FIG. 5. The fluctuation of the graph up and down applies to light illuminating on the chip substrate pattern.

Figure 7:
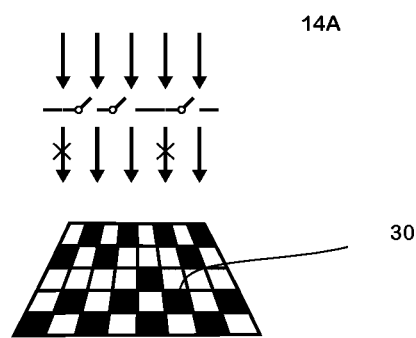
FIG. 7 is a schematic diagram illustrating the parallel light being used to pass through the digitally controlled array of liquid crystals for catalyzing a reaction onto the substrate.

FIG. 7 shows the parallel light being used to illuminate the chip substrate 30. The on/off switch controls of the UV light allow the chip designer to layout the substrate pattern while the chip designer can visually view the chip pattern design on the monitor of a computer screen. One method of substrate patterning is by illuminating light directly onto the chip substrate including visual observation and control of the substrate patterns with the computer. Another method of substrate patterning is by illuminating light at an angled direction onto the chip substrate by controlling the crystal arrays and illuminating UV light with the computer.

Figure 8:
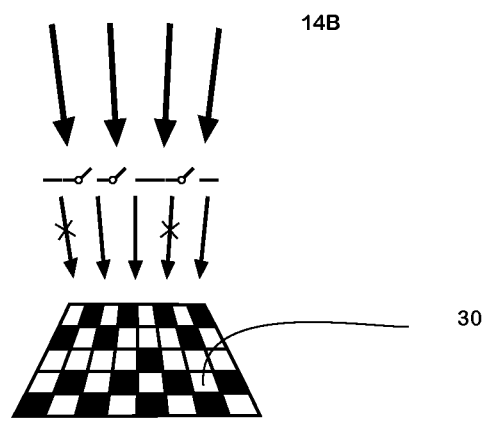
FIG. 8 is a schematic diagram illustrating the shrink light being used to pass through the digitally controlled array of liquid crystals for catalyzing a reaction onto the substrate.

FIG. 8 shows the shrink light being used to illuminate the chip substrate 30. The on/off switch controls the layout of the substrate pattern while the chip designer can visually view the chip pattern design on the monitor of a computer screen. The angled light illuminating allows the chip designed to control the design pattern for layout of the chip substrate.

Referring back to FIG. 1, the UV light 12 illuminates onto the transparent glass substrate 40. A negative electrode layer 41 and a positive electrode layer 42 surrounds the digital liquid crystal array 43. Passing through the crystal array, the light is patterned according to the designed pattern in the computer. The substrate is then exposed to reaction reagents or chemicals, e.g., by flooding a reaction chamber 30. A light catalyzed reaction takes place at the site or sites where light strikes the chip substrate. The control commands in FIG. 5 allow a program to determine when the last patterning step has occurred. If more patterning and catalytic steps are required, the control program provides the steps for continuing the chip substrate patterning.

The present invention can be used to improve the fabrication of printed circuit boards in the semiconductor applications. More particularly, in micro fabrication of semiconductor applications. Since micro fabrication is the process of fabrication of miniature structures of micrometer scales and smaller. In the last few decades, integrated circuit chip fabrication, which is also known as semiconductor manufacturing has used micro fabrication in the fields of micro electro mechanical systems. More recently, this has extended into nanoscale in nano electro mechanical systems. The advancement of technology in these fields has adapted and extended micro fabrication methods. Furthermore, Flat Panel displays and solar cells are also using similar techniques. However, miniaturization of devices presents challenges in many areas of engineering and science including physics, chemistry, and material science and computer science Fabrication processes and equipment design are also affected. Within the micro fabrication discipline, there are applications such as doping, thin films, etching, and bonding. Lithography is part of an older collection of technologies that creates micro fabrication.

To fabricate a micro device, many processes must be performed, one after the other, many times repeatedly. These processes typically include depositing a film, patterning the film with the desired micro features, and removing (or etching) portions of the film. An example of this is in memory chip fabrication there are some 30 lithography steps, 10 oxidation steps, 20 etching steps, 10 doping steps, and many others are performed. The complexity of micro fabrication processes can be described by their mask count. This is the number of different pattern layers that constitute the final device. Modern microprocessors are made with several masks while a few masks suffice for a microfluidic device or a laser diode. Micro fabrication resembles multiple exposure photography, with many patterns aligned to each other to create the final structure.

Micro fabricated devices are not generally freestanding devices but are usually formed over or in a thicker support substrate. For electronic applications, semiconducting substrates such as silicon wafers can be used. For optical devices or flat panel displays, transparent substrates such as glass or quartz are common. The substrate enables easy handling of the micro device through the many fabrication steps. Often many individual devices are made together on one substrate and then separated into separated devices toward the end of fabrication.

Micro fabricated devices are typically constructed using one or more thin films. The purpose of these thin films depends on the type of device. Electronic devices may have thin films which are conductors (metals), insulators (dielectrics) or semiconductors. Optical devices may have films which are reflective, transparent, light guiding or scattering. Films may also have a chemical or mechanical purpose as well as for MEMS applications.

The present invention can also provide a more efficient and cost effective system for substrate patterning in the field of micro fabrication. The real potential of MEMS is becoming fulfilled as miniaturized sensors, actuators, and structures can all be merged onto a common silicon substrate along with the integrated circuits (i.e., microelectronics). The electronics are fabricated using integrated circuit process sequences including CMOS, Bipolar, or BICMOS processes. With the emerging fields of photonics, microelectronics, and nanotechnology, the present invention can improve the speed, cost, and efficiency of substrate patterning on chips which applies to the aforementioned fields of technology. These technologies are filled with numerous commercial market opportunities.

The invention may be used in biochemical engineering such as biosynthesis wherein different layers of light exposure are required in a specific period of time. Genechip oligonucleotide probe arrays are used to access genetic information contained in both the RNA (gene expression monitoring) and DNA (genotyping) content of biological samples. Currently, the most popular application for oligonucleotide microarray is in monitoring cellular gene expression.

As the human genome project finishes the first complete blueprint of the human genome, there is tremendous interest in identifying the variations in DNA sequences between individuals and relating these variations to phenotypes. It is of particular interest to understand how subtle sequence differences are associated with disease. Oligonucleotide array (DNA) are well suited to probe these variations, particularly single-nucleotide substitutions and, to a lesser degree, short deletions and insertions. Oligonucleotide arrays are currently used primarily for genotyping analysis. Arrays for mutation or variant detection are used to screen sets of contiguous sequence for single-nucleotide differences.

While oligonucleotide arrays have been used primarily to determine the composition of RNA or DNA, many other applications are possible as well. Any methodology that involves capturing large numbers of molecules that will hybridize to oligonucleotides can conceivably benefit from the highly parallel nature of these microarrays. Furthermore, the hybridized molecules, which are essentially libraries, can serve as a platform for subsequent analyses based on biochemical reactions One promising application of the present invention is in the mass production of genechip oligonucleotide probe arrays. A typical method of fabrication genechip is using mask and UV light source in the photolithographic synthesis of oligonucleotide arrays. One of the top players in the industry uses more than hundreds of masks to develop specific genechip for the market. Once another genechips are needed for different application, all the masks need to be redesigned and fabricated accordingly. Furthermore, there are tens of thousands of different applications which cost a lot for the masks themselves. Also, mask need to be changed and realigned after each light-directed oligonucleotide synthesis cycle. It needs extra expensive equipment or parts to do that and it also make the fabrication step slow or not continuously.

With the present invention, the time of fabricate masks and the high cost are saved. Under the control of a computer, the light exposure of the whole chip/wafer area is accurately controlled through the scan of each tiny area (in μm or nm lever) in high frequency electrical signal. Thus, the cycles of light exposure and the follow oligonucleotide synthesis are continuously without any need of physical movement of mask or chip.

One skilled in the art will further appreciate the features and combinations from the above described embodiments. Accordingly, the invention should not be limited by what has been particularly shown and described, unless indicated by the claims.

The invention claimed is:

1. A system for patterning on a substrate comprising a light source, a light patterning device, and a controller coupled to a computer to control said light patterning device, wherein said light patterning device comprises a transparent glass substrate as a negative electrode facing said light source, a transparent glass substrate as positive electrode, and an array of liquid crystals, each of said liquid crystals having an on and off status digitally controlled by said computer, wherein when a liquid crystal's status is on, light from said light source passes through said liquid crystal, and when said liquid crystal's status is off, light from said light source is blocked from passing through said liquid crystal, and wherein said array of liquid crystals' configuration is determined by a digital file for one or more particular patterns such that light beam after passing through said light patterning device represents said one or more particular patterns.

2. The system of claim 1, wherein said light source provides a parallel light beam.

3. The system of claim 1, wherein said light source provides a shrink light beam.

4. The system of claim 1, wherein said light source provides UV light beam or deep UV light beam.

5. The system of claim 1 further comprising a chemical reaction chamber immediately below said light patterning device, wherein light beam from said light patterning device catalyzes a chemical reaction on a chip substrate placed inside of said chamber.

6. The system of claim 1 further comprising a biochemical chamber immediately below said light patterning device, wherein light beam from said light patterning device catalyzes a biosynthesis on a surface of an object placed inside of said chamber.

7. The system of claim 1, wherein said light patterning device and said light source are integrated in one physical body.

\* \* \* \* \*